United States Patent
Dupret et al.

(10) Patent No.: US 12,000,880 B2
(45) Date of Patent: Jun. 4, 2024

(54) METHOD FOR REDUCING THE PEAK POWER OF A MULTI-CARRIER REFLECTOMETRY SIGNAL

(71) Applicant: COMMISSARIAT A L'ENERGIE ATOMIQUE ET AUX ENERGIES ALTERNATIVES, Paris (FR)

(72) Inventors: Antoine Dupret, Orsay (FR); Esteban Cabanillas, Saint-Egreve (FR); Hugues Duvillier, Poulangy (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 247 days.

(21) Appl. No.: 17/621,578

(22) PCT Filed: Jun. 11, 2020

(86) PCT No.: PCT/EP2020/066178
§ 371 (c)(1),
(2) Date: Dec. 21, 2021

(87) PCT Pub. No.: WO2020/260031
PCT Pub. Date: Dec. 30, 2020

(65) Prior Publication Data
US 2022/0357385 A1 Nov. 10, 2022

(30) Foreign Application Priority Data
Jun. 26, 2019 (FR) ........................... 1906962

(51) Int. Cl.
*G01R 31/11* (2006.01)

(52) U.S. Cl.
CPC .................................... *G01R 31/11* (2013.01)

(58) Field of Classification Search
CPC ........................................................ G01R 31/11
See application file for complete search history.

(56) References Cited

PUBLICATIONS

Friese,"Multitonesignalswithlowcrestfactor",IEEETransactionsonCommunications, vol. 45, Issue:10, p. 1338-1344,Oct. 1997. (Year: 1997).*
Cabanillas,etal.,"EnhancingtheSpatialResolutionforWireFaultDetectionSystemsUsingMulti-CarrierSignals", IEEESensorsJournal,vol. 18,Issue:23,pp. 9857-9866,Dec. 1, 2018. (Year: 2018).*

(Continued)

*Primary Examiner* — Alesa Allgood
(74) *Attorney, Agent, or Firm* — BakerHostetler

(57) ABSTRACT

A method for generating a reflectometry signal intended to be injected into a transmission line in order to identify the presence of at least one possible fault on the line, the method includes the steps of: generating a first multi-carrier digital signal on a first set of frequency carriers, generating a second corrective multi-carrier digital signal on a second set of frequency carriers separate from the first set, summing the first digital signal and the second corrective digital signal so as to generate a reflectometry signal, normalizing the frequency carriers of the reflectometry signal, the second corrective digital signal being determined so as to reduce the peak to average power ratio of the reflectometry signal with respect to the first digital signal.

17 Claims, 11 Drawing Sheets

(56) References Cited

PUBLICATIONS

Lelong, et al., "On Line Wire Diagnosis using Multicarrier Time Domain Reflectometry for Fault Location", Sensors Conference, IEEE, pp. 751-754, Oct. 2009.

Tellado, et al., "Peak power reduction for multicarrier transmission", Citeseer, 1999.

Friese, "Multitone signals with low crest factor", IEEE Transactions on Communications, vol. 45, Issue: 10, pp. 1338-1344, Oct. 1997.

Cabanillas, et al., "Enhancing the Spatial Resolution for Wire Fault Detection Systems Using Multi-Carrier Signals", IEEE Sensors Journal, vol. 18, Issue: 23, pp. 9857-9866, Dec. 1, 2018.

Levy, et al., "Peak to Average Power Ratio Reduction for Filter Bank Multicarrier Modulation using Iterative Clipping and Filtering", 2018 IEEE International Conference on the Science of Electrical Engineering in Israel (ICSEE), 2018.

Kulkarni, et al., "An overview of various techniques to reduce the Peak-to-average power ratio in multicarrier transmission systems", 2012 IEEE International Conference on Computational Intelligence and Computing Research, Dec. 2012.

\* cited by examiner

METHOD FOR REDUCING THE PEAK POWER OF A MULTI-CARRIER REFLECTOMETRY SIGNAL

CROSS-REFERENCE TO RELATED APPLICATIONS

This application is a National Stage of International patent application PCT/EP2020/066178, filed on Jun. 11, 2020, which claims priority to foreign French patent application No. FR 1906962, filed on Jun. 26, 2019, the disclosures of which are incorporated by reference in their entirety.

FIELD OF THE INVENTION

The invention relates to the field of wired diagnostic systems based on the principle of reflectometry for identifying and characterizing electrical faults on cables or, more generally, on transmission lines. The invention relates more precisely to the field of multi-carrier reflectometry, which uses multi-carrier signals generated based on the OFDM (orthogonal frequency division multiplexing) modulation principle.

One subject of the invention is a method for generating a multi-carrier reflectometry signal having a peak to average power ratio that is lower in comparison with a conventional multi-carrier signal.

BACKGROUND

Cables are omnipresent in all electrical systems in order to supply power or to transmit information. These cables are subject to stresses and may fail. It is therefore necessary to be able to analyze their state and provide information about the detection of faults that impact these cables, this information including the existence of faults, but also their location and their type. Fault analysis makes it possible to assist with cable maintenance. Conventional reflectometry methods enable this type of analysis.

Reflectometry methods use a principle close to that of radar: an electrical signal, the probe signal or reference signal, is injected at one or more locations of the cable to be tested. The signal propagates in the cable or the network of cables and returns a portion of its energy when it encounters an electrical discontinuity. An electrical discontinuity may be caused for example by a connection, by the end of the cable or by a fault or more generally by an interruption of the propagation conditions for the signal in the cable. It is caused by a fault that locally modifies the characteristic impedance of the cable by bringing about a discontinuity in its linear parameters.

Analyzing the signals returned to the injection point makes it possible to deduce therefrom information about the presence and the location of these discontinuities, and therefore possible faults. An analysis in the time or frequency domain is usually performed. These methods are denoted using the acronyms TDR, stemming from the expression "time domain reflectometry", and FDR, stemming from the expression "frequency domain reflectometry".

Multi-carrier reflectometry (MCR) uses multi-carrier signals. Its advantage is the great flexibility with which it is possible to modulate the spectrum of the transmitted signal, thereby thus making it possible to adapt to constraints specific to on-line diagnostics. For example, although it is forbidden to transmit on a frequency band located in the middle of the spectrum of the test signal, it is entirely possible to cancel out the energy of the signal on this frequency band. MCTDR ("Multi-carrier time domain reflectometry") reflectometry is also known, as described in the document referenced [1].

The invention falls under the field of application of reflectometry-based wired diagnostic methods, and is applicable to any type of electric cable, in particular energy transmission cables or communication cables, in fixed or mobile installations. The cables in question may be coaxial, bifilar, in parallel rows, in twisted pairs or in another arrangement, provided that it is possible to inject a reflectometry signal into them at a point of the cable and to measure its reflection at the same point or at another point.

One problem to be solved in a wired diagnostic system relates to the attenuation experienced by the signal injected into the cable to be analyzed, when it propagates along this cable until encountering a fault that causes a reflection. The reflection peak is usually determined through intercorrelation between the injected signal and the reflected signal. When the cable is lengthy compared to the wavelength of the signal, said signal experiences attenuation during propagation and back-propagation thereof, which is dependent on the distance traveled by the signal. This attenuation constitutes a major drawback during the step of analyzing the reflected signals through time reflectometry, which aims to identify an amplitude peak in the result of the intercorrelation between the transmitted signal and the reflected signal. Specifically, the more the signal is attenuated, the more difficult it is to detect the signature of a fault in the measurement of the reflected signal. This is all the more true when the targeted fault is a soft fault, that is to say one that corresponds to a small impedance interruption, that is to say a superficial fault.

To limit the attenuation of the signal during propagation thereof in a cable, it is therefore desirable to use an amplifier to amplify the signal before it is injected in order to compensate for the effects of the attenuation.

However, signal amplifiers have a non-linear behavior that leads to saturation of high values of the signal to be amplified. This non-linear behavior is all the more present when the signal to be amplified has a high peak to average power ratio (or PAPR). This is the case for multi-carrier signals such as OFDM (orthogonal frequency division multiplexing) signals, or signals specifically dedicated to reflectometry, such as MCTDR (multi-carrier time domain reflectometry) or OMTDR (orthogonal multi-carrier time domain reflectometry) signals that are based on the OFDM principle.

This non-linear behavior worsens the signal-to-noise ratio of the measurements that are performed, thereby producing a detrimental effect on the accuracy of the detection of faults, or even non-detection of faults in some cases, in particular for the case of soft faults.

There is therefore a need to reduce or limit the peak power of multi-carrier signals that are intended to be used by a reflectometry system. Another constraint to be complied with is that of ensuring that the reflectometry signal that is generated has good autocorrelation properties so as to allow detection and accurate location of faults.

In general, some solutions for reducing the peak power of OFDM signals do exist in the field of digital communication systems. However, they do not take into account the particular constraints of reflectometry systems, and are not able to be transposed directly to the diagnosis of electrical faults.

A first existing solution for reducing the peak power of multi-carrier signals consists in coding the signal with specific sequences of modulating signals, such that summing the modulated signals reduces the peak power of the signal. The coding consists in discretely modifying the amplitude and the phase of each subcarrier using a binary code of N bits per subcarrier. This solution is able to be used in the field of digital communications, but not for reflectometry signals, which have a much shorter duration. Moreover, it may require a decoding step at the reception stage, which adds complexity to the reflectometry system.

A second known solution consists in introducing distortion into the signal by limiting the amplitude of the peaks of the signal, that is to say by clipping the signal. This method has the advantage of being easy to implement, but it leads to distortions in the intercorrelation between the reflectometry signal that is generated and the echo of this signal that is used to determine a reflectogram. One drawback of this method is that it degrades the accuracy of detecting faults based on analyzing the reflectogram.

A third known solution consists in adding a compensation signal to the multi-carrier signal, but only on free subcarriers. The distortion on the signal is thereby limited. This method is described for example in reference [2], which presents an application of this solution for OFDM signals used in the field of digital communications. One drawback of this solution is that it produces a signal whose power spectral density is not uniform, thereby leading to degradations on the reflectogram computed from this signal. This solution is therefore not directly applicable to the field of reflectometry.

SUMMARY OF THE INVENTION

The invention proposes a method for minimizing the peak to average power ratio in order to generate a multi-carrier reflectometry signal by way of a carrier reservation method associated with a normalization step that makes it possible to ensure that the generated signal has a uniform power spectral density.

One subject of the invention is a method for generating a reflectometry signal intended to be injected into a transmission line in order to identify the presence of at least one possible fault on the line, the method comprising the steps of:
  generating a first multi-carrier digital signal on a first set of frequency carriers,
  generating a second corrective multi-carrier digital signal on a second set of frequency carriers separate from the first set,
  summing the first digital signal and the second corrective digital signal so as to generate a reflectometry signal,
  normalizing the frequency carriers of the reflectometry signal,
  the second corrective digital signal being determined so as to reduce the peak to average power ratio of the reflectometry signal with respect to the first digital signal.

According to one variant embodiment, the method according to the invention furthermore comprises a step of injecting the reflectometry signal into a transmission line.

According to one particular aspect of the invention, the step of generating a second corrective digital signal comprises the substeps of:
  Applying an inverse Fourier transform to the first multi-carrier digital signal,
  Clipping the signal obtained at the output of the inverse Fourier transform at a predetermined clipping value,
  Applying a direct Fourier transform to the clipped signal,
  Masking the output signal from the direct Fourier transform so as to zero the frequencies of the frequency carriers of the first digital signal.

According to one particular aspect of the invention, the substeps for generating the second corrective digital signal are iterated.

According to one particular aspect of the invention, the clipping value is determined so as to minimize the peak to average power ratio of the reflectometry signal.

According to one variant embodiment, the method according to the invention furthermore comprises a step of selecting the number of frequency carriers allocated to the first digital signal.

Another subject of the invention is a method for identifying the presence of at least one possible fault on a transmission line, the method comprising the steps of:
  generating a first multi-carrier digital signal on a first set of frequency carriers,
  generating a second corrective multi-carrier digital signal on a second set of frequency carriers separate from the first set,
  summing the first digital signal and the second corrective digital signal so as to generate a reflectometry signal,
  normalizing the frequency carriers of the reflectometry signal,
  the second corrective digital signal being determined so as to reduce the peak to average power ratio of the reflectometry signal with respect to the first digital signal,
  injecting the reflectometry signal into a transmission line,
  acquiring and analyzing the echo of said reflected reflectometry signal in order to deduce therefrom information relating to the detection and/or the location of an impedance discontinuity characteristic of at least one fault.

According to one variant embodiment, the step of analyzing the echo of the reflectometry signal comprises the substeps of:
  computing the intercorrelation between the reflected reflectometry signal and the reflectometry signal injected into the line, in order to obtain a reflectogram,
  analyzing the reflectogram in order to identify at least one amplitude peak characteristic of the presence of a fault on the line.

Another subject of the invention is a computer program comprising instructions for executing the method for generating a reflectometry signal according to the invention when the program is executed by a processor.

Another subject of the invention is a recording medium able to be read by a processor and on which there is recorded a program comprising instructions for executing the method for generating a reflectometry signal according to the invention when the program is executed by a processor.

Another subject of the invention is a device for generating a reflectometry signal intended to be injected into a transmission line in order to identify the presence of at least one possible fault on the line, said device comprising means designed to implement the method for generating a reflectometry signal according to the invention.

According to one particular variant, the device for generating a reflectometry signal according to the invention comprises a reflectometry signal generator configured so as to implement the method for generating a reflectometry signal according to the invention, a digital-to-analog converter and a coupling device for injecting the analog reflectometry signal into a transmission line.

Another subject of the invention is a device for identifying the presence of at least one possible fault on a transmission line, said device comprising means designed to implement the method for identifying the presence of at least one fault according to the invention.

According to one particular variant, the identification device comprises a coupling device for acquiring an echo of the reflected reflectometry signal, an analog-to-digital converter and a processing device for analyzing the echo.

BRIEF DESCRIPTION OF THE DRAWINGS

Other features and advantages of the present invention will become more clearly apparent upon reading the following description with reference to the following appended drawings.

DETAILED DESCRIPTION

Figure 1:
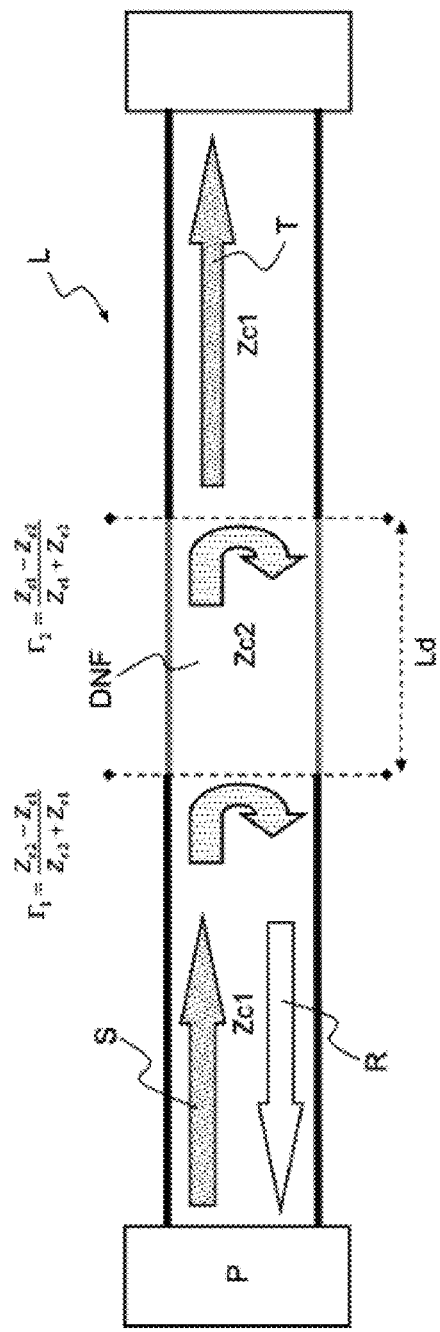
FIG. 1 shows a diagram illustrating the known principle of time reflectometry and its application to the detection of a soft fault.

FIG. 1 schematically shows, as a reminder, the operating principle of a reflectometry-based diagnostic method applied to a transmission line L exhibiting a soft fault DNF. The example described below corresponds to a time reflectometry method.

A reference signal S is injected into the transmission line at a point P. The reflected signal R is measured at the same point P (or at another point of the line). This signal propagates in the line and encounters, while it is propagating, a first impedance discontinuity at the start of the soft fault DNF. The signal reflects off this discontinuity with a reflection coefficient $\Gamma_1$. If the characteristic impedance $Z_{c2}$ in the region of the soft fault DNF is less than the characteristic impedance $Z_{c1}$ before the occurrence of the fault, then the reflection coefficient $\Gamma_1$ is negative and is expressed by a peak of negative amplitude in the reflected signal R. In the opposite case, the reflection coefficient $\Gamma_1$ is positive and is expressed by a peak of positive amplitude in the reflected signal R.

The transmitted part T of the incident signal S continues to propagate in the line and then encounters a second impedance discontinuity, creating a second reflection of the incident signal with a reflection coefficient $\Gamma_2$ of a sign opposite to the first reflection coefficient $\Gamma_1$. If $\Gamma_1<0$, then $\Gamma_2>0$. If $\Gamma_1>0$, then $\Gamma_2<0$.

Figure 2:
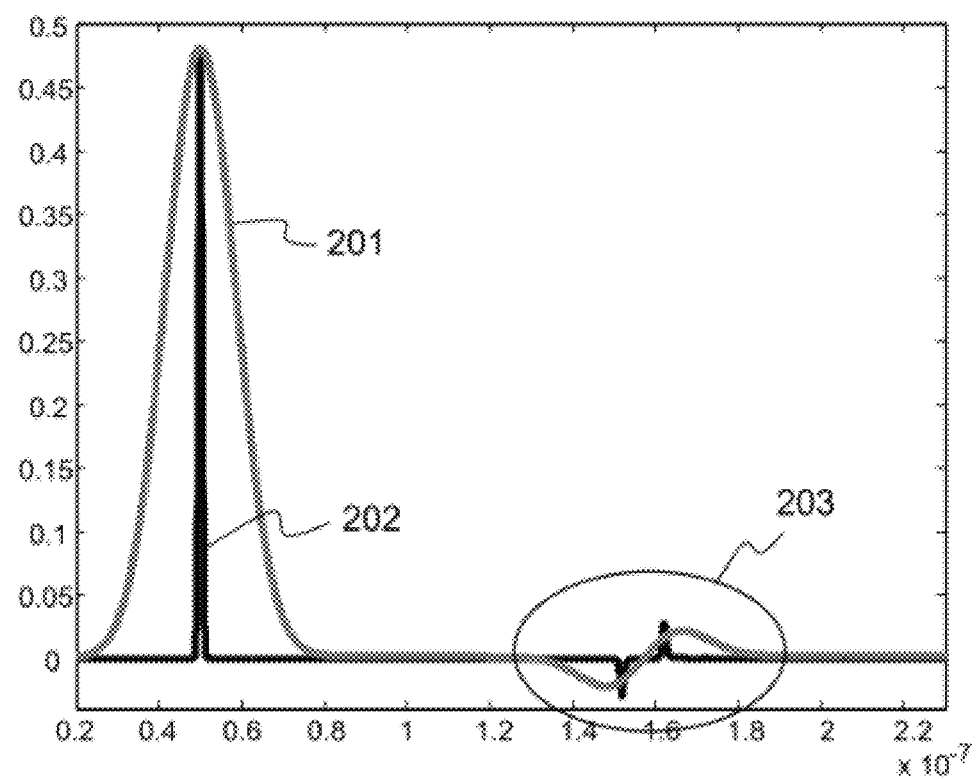
FIG. 2 shows an example of two reflectograms, illustrating the trend of the signature of a soft fault, one obtained by injecting a signal having high-frequency components, the other by injecting a signal having low-frequency components.

Thus, by observing the reflected signal R, the signature of the soft fault DNF is characterized by two successive peaks of opposing signs, as shown in FIG. 2.

FIG. 2 shows a time reflectogram that corresponds either directly to the measurement of the reflected signal R or to the intercorrelation between the reflected signal R and the signal injected into the cable S.

If the injected reference signal is a temporal pulse, which corresponds to the case of a time reflectometry method, the reflectogram may correspond directly to the measurement of the reflected signal R. If the injected reference signal is a more complex signal, for example for MCTDR (multi-carrier time domain reflectometry) or OMTDR (orthogonal multi-tone time domain reflectometry) methods, then the reflectogram is obtained by intercorrelating the reflected signal R and the injected signal S.

FIG. 2 shows two reflectograms 201, 202 corresponding to signals having, respectively, two different maximum frequencies. The curve 201 corresponds to a pulse duration $2 \cdot \Delta T$ much greater than the time taken by the signal to pass through the soft fault DNF. With the length of the fault being denoted Ld, this duration is equal to Ld/V, where V is the propagation speed of the signal in the cable. The curve 202 corresponds to a pulse duration $2 \cdot \Delta T$ much less than the time taken by the signal to pass through the soft fault DNF.

In both cases, the signature 203 of the soft fault, in the reflectogram, always consists of the succession of a first peak and a second peak of opposing signs.

The distance between the two peaks represents the length of the soft fault, and their amplitude represents the severity of the soft fault. Specifically, the greater the variation in the characteristic impedance, the greater also the amplitude of the signature of the soft fault in the reflectogram.

As is known in the field of reflectometry-based diagnostic methods, the position $d_{DNF}$ of the soft fault on the cable, in other words its distance from the injection point P of the signal, may be obtained directly from the measurement, on the time reflectogram of FIG. 2, of the duration $t_{DNF}$ between the first amplitude peak recorded on the reflectogram (at the abscissa 0.5 in the example of FIG. 3) and the amplitude peak 203 corresponding to the signature of the soft fault.

Various known methods may be contemplated for determining the position $d_{DNF}$. A first method consists in applying the relationship linking distance and time: $d_{DNF}=V \cdot t_{DNF}$, where V is the propagation speed of the signal in the cable. Another possible method consists in applying a proportionality relationship of the type $d_{DNF}/t_{DNF}=L/t_0$, where L is the length of the cable and $t_0$ is the duration, measured on the reflectogram, between the amplitude peak corresponding to the impedance discontinuity at the injection point and the amplitude peak corresponding to the reflection of the signal off the endpoint of the cable.

Figure 3:
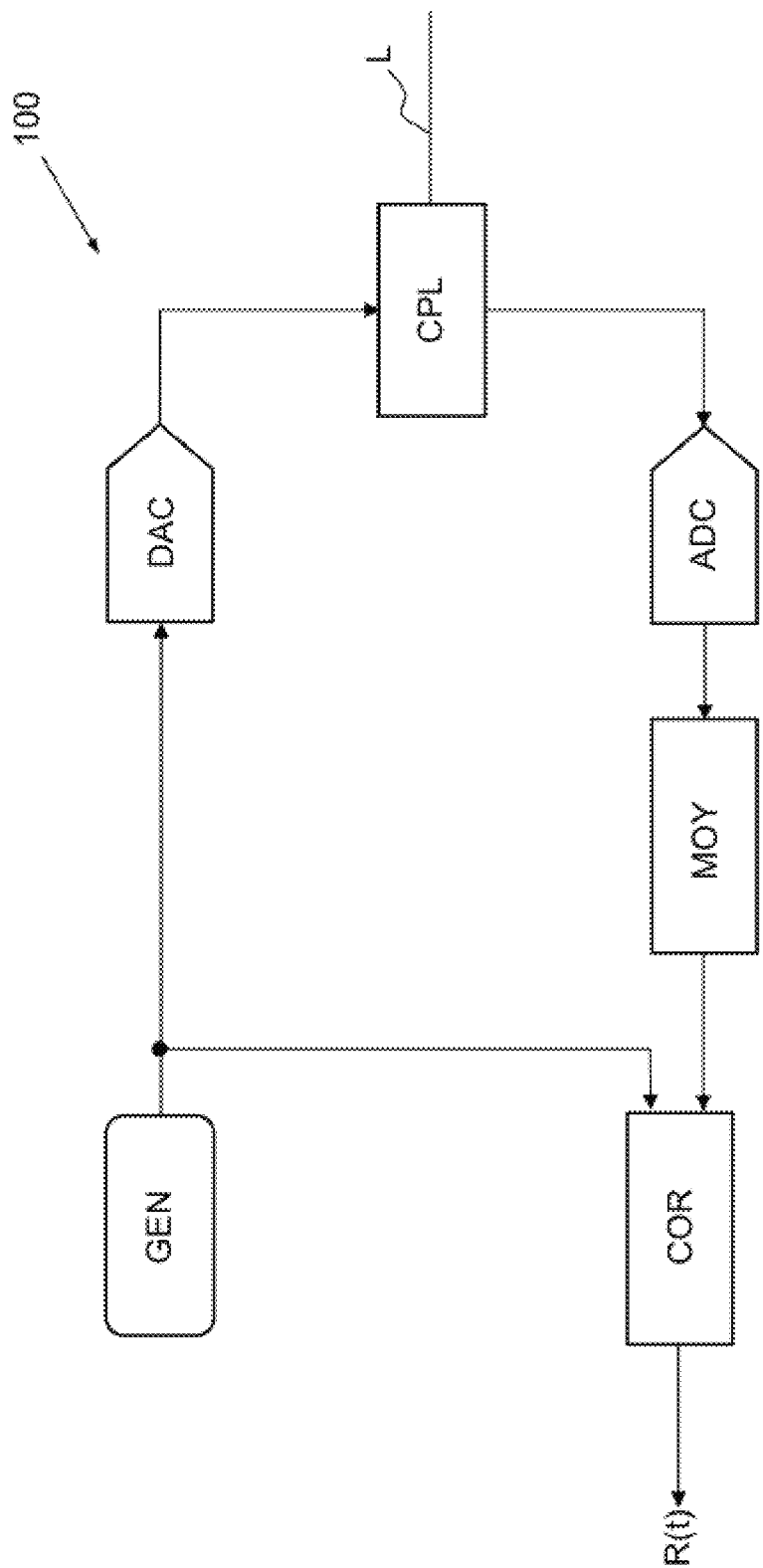
FIG. 3 shows a diagram of one example of a reflectometry system.

FIG. 3 shows a diagram of a system 100 for analyzing faults in a transmission line L, such as a cable. The system 100 is able to implement the invention. Such a system primarily comprises a generator GEN for generating a reference signal. The digital reference signal that is generated is converted into analog via a digital-to-analog converter DAC and is then injected at a point of the transmission line L by way of a coupler CPL or any other device for injecting a signal into a line. The signal propagates along the line and reflects off the singularities that it contains. In the absence of a fault on the line, the signal reflects off the endpoint of the line if the termination of the line is not matched. In the presence of a fault on the line, the signal reflects off the impedance discontinuity caused by the fault. The reflected signal is propagated back to a measurement point, which may be the same as the injection point or different. The back-propagated signal is converted into digital by an analog-to-digital converter ADC. Optionally, an averager MOY is added at the output of the converter ADC. A correlation COR is then made between the measured digital signal and a copy of the digital signal generated prior to injection in order to produce a time reflectogram R(t) corresponding to the intercorrelation between the two signals.

A processing unit (not shown in FIG. 3), such as a computer, personal digital assistant or the like, is furthermore used to control the reflectometry system and display the results of the measurements on a human-machine interface.

The displayed results may comprise one or more reflectograms computed using the method according to the invention and/or information relating to the existence and to the location of a fault on the cable, also produced by the method according to the invention. The displayed results may also comprise one or more frequency bands selected by the invention to be used to diagnose faults on a given cable.

Figure 4:
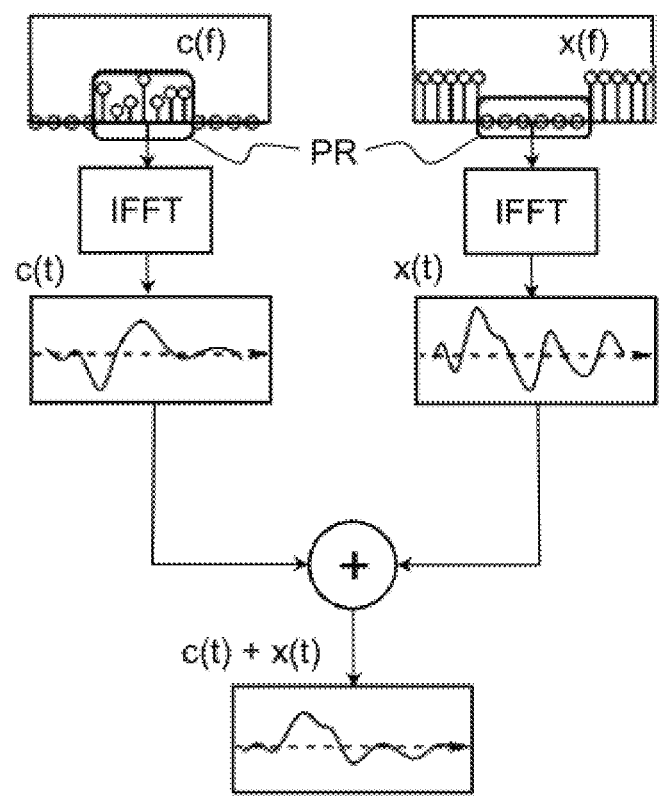
FIG. 4 shows a diagram illustrating the principle of reducing the peak power of an OFDM signal through carrier reservation.

FIG. 4 schematically shows the general principle of a method for reducing the peak to average power ratio through carrier reservation. The term peak factor or the acronym PAPR is used hereinafter to denote the peak to average power ratio of a signal, that is to say the ratio between its maximum power and its average power.

The general principle of this method, applied to an OFDM multi-carrier signal, consists in reserving some PR of the carriers for a compensation signal c(t) that is added to the payload signal x(t) so as to reduce the maximum amplitude of the peaks of the resulting signal.

As shown schematically in FIG. 4, the compensation signal c(t) is generated on a set PR of carriers separate from the set of carriers on which the payload signal x(t) is generated. In other words, the carriers of the set PR are reserved for the addition of a compensation signal c(t). The number of carriers of the set PR is a parameter of the method.

The two signals c(t) and x(t) are summed so as to produce the modified OFDM signal, which has a reduced peak factor compared to the initial signal x(t).

The method described in FIG. 4 may be used for OFDM signals that are intended to be used for communications systems, notably radio communications systems. However, they cannot be used directly as reflectometry signals, for the reasons illustrated in FIG. 5.

Figure 5:
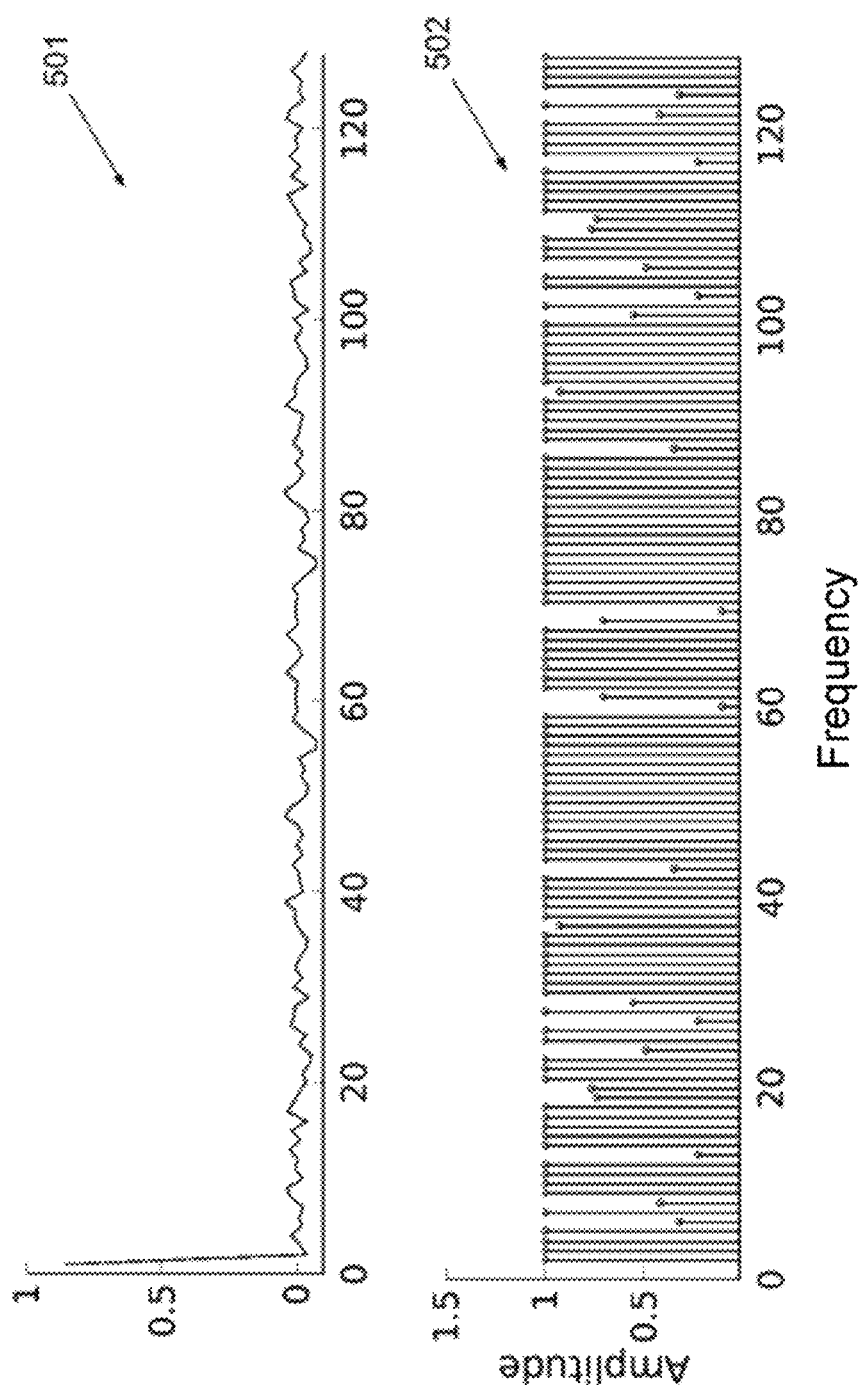
FIG. 5 illustrates two graphs showing the autocorrelation of a signal obtained using a carrier reservation method.

FIG. 5 shows, on the graph 502, one example of the spectrum of an OFDM signal obtained by applying the method of FIG. 4. The carriers reserved for the compensation signal c(t) are shown in bold. The graph 501 shows the autocorrelation function of the signal. Because the power spectral density of the signal obtained is not uniform, the autocorrelation function has secondary lobes that generate a non-negligible level of distortion. However, for reflectometry applications, it is crucial that the signal that is used has good autocorrelation properties, that is to say with the lowest possible level of distortion around the main autocorrelation peak. Specifically, one drawback of the signal shown in FIG. 5 is that it does not make it possible to detect soft faults that generate an echo whose amplitude is less than the distortion noise of the autocorrelation function.

For this reason, the method described in FIG. 4 does not make it possible to generate a signal that has the properties expected for a reflectometry application.

To solve this problem, it is proposed to add a step of normalizing the signal generated by way of the method of FIG. 4, so as to make the power density of the signal uniform and to limit the distortion noise of the autocorrelation function.

Figure 6:
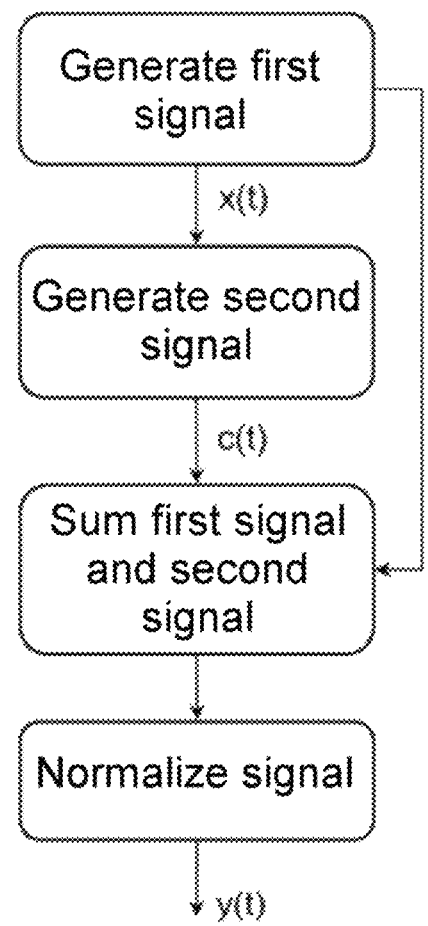
FIG. 6 shows a flowchart illustrating the general steps for implementing the invention.

The main steps of the method according to the invention are described in FIG. 6. Steps 601, 602, 603 correspond to the steps already described in FIG. 4. In other words, in a first step 601, the payload signal x(t) is generated on a first set of carriers. In a second step 602, the compensation signal c(t) is generated on a second set of carriers separate from the first set. In a third step 603, the signals x(t) and c(t) are summed. According to the invention, a fourth step 604 of normalizing the signal is added so as to make the power spectral density uniform.

The reflectometry signal obtained by applying the method according to the invention may be pre-computed and stored in a memory before being injected into the transmission line by way of the device of FIG. 3. As an alternative, the invention may be implemented directly within the signal generator GEN.

Figure 7A:
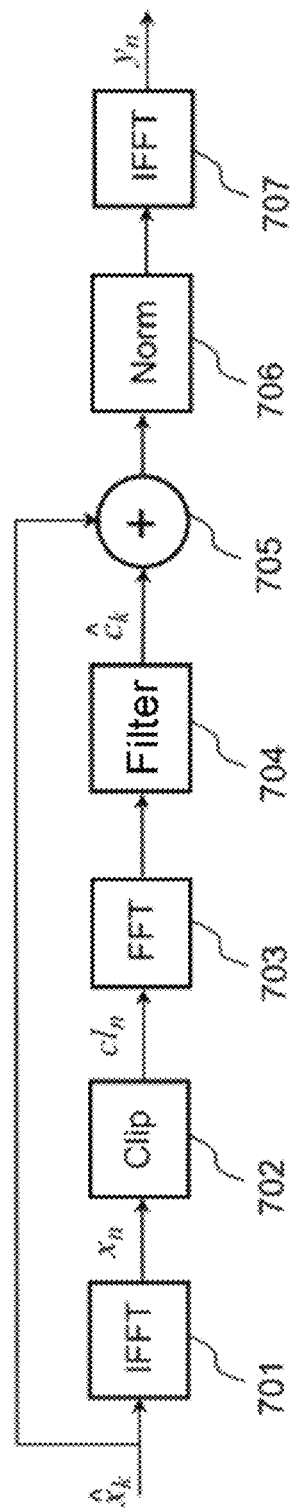
FIG. 7a shows a diagram illustrating the steps for implementing the invention according to one particular embodiment.

FIG. 7a schematically shows the steps of one exemplary embodiment of the method according to the invention. The payload signal $x_k$ is received at the start of the method, and an inverse Fourier transform 701 is applied thereto in order to return the signal to the time domain $x_n$. A clipping step 702 is then applied to the signal. This step 702 consists in clipping the signal at a predetermined threshold value A by applying the following relationships:

$$cl_n = x_k, si |x_k| \leq A$$

$$cl_n = A \cdot \operatorname{sign}(x_k), |x_k| > A \qquad \text{[Math. 1]}$$

Sign( ) denotes the sign function and |·| denotes the absolute value function.

The clipped signal $cl_n$ is then converted 703 into the frequency domain via a direct Fourier transform. A filtering or masking step 704 is then applied to the signal so as to reset the carriers reserved for the payload signal to zero in order to produce the compensation signal $c_k$, which is then summed 705 to the payload signal $x_k$. A normalization step 706 is thereafter applied to the resulting signal, and then an indirect Fourier transform step 707 is applied in order to convert the normalized signal into the time domain and produce the final reflectometry signal $y_n$. The normalization step 706 consists for example in normalizing the amplitude of each subcarrier to 1, while retaining the value of the phase.

Figure 7B:
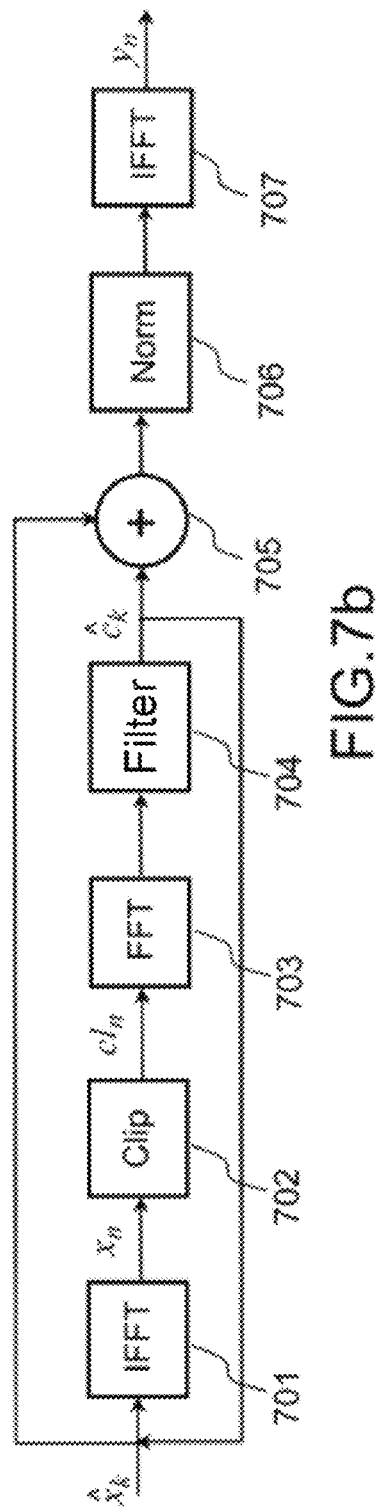
FIG. 7b shows a diagram illustrating one variant of the embodiment described in FIG. 7a, FIG. 8 illustrates two graphs showing the autocorrelation of a signal obtained using the invention.

In one variant embodiment illustrated in FIG. 7b, steps 701 to 705 are iterated one or more times so as to improve the peak factor. In other words, at the end of an iteration, the output signal of the sum 705 is reinjected at the start of the method instead of the initial payload signal $x_k$.

Figure 8:
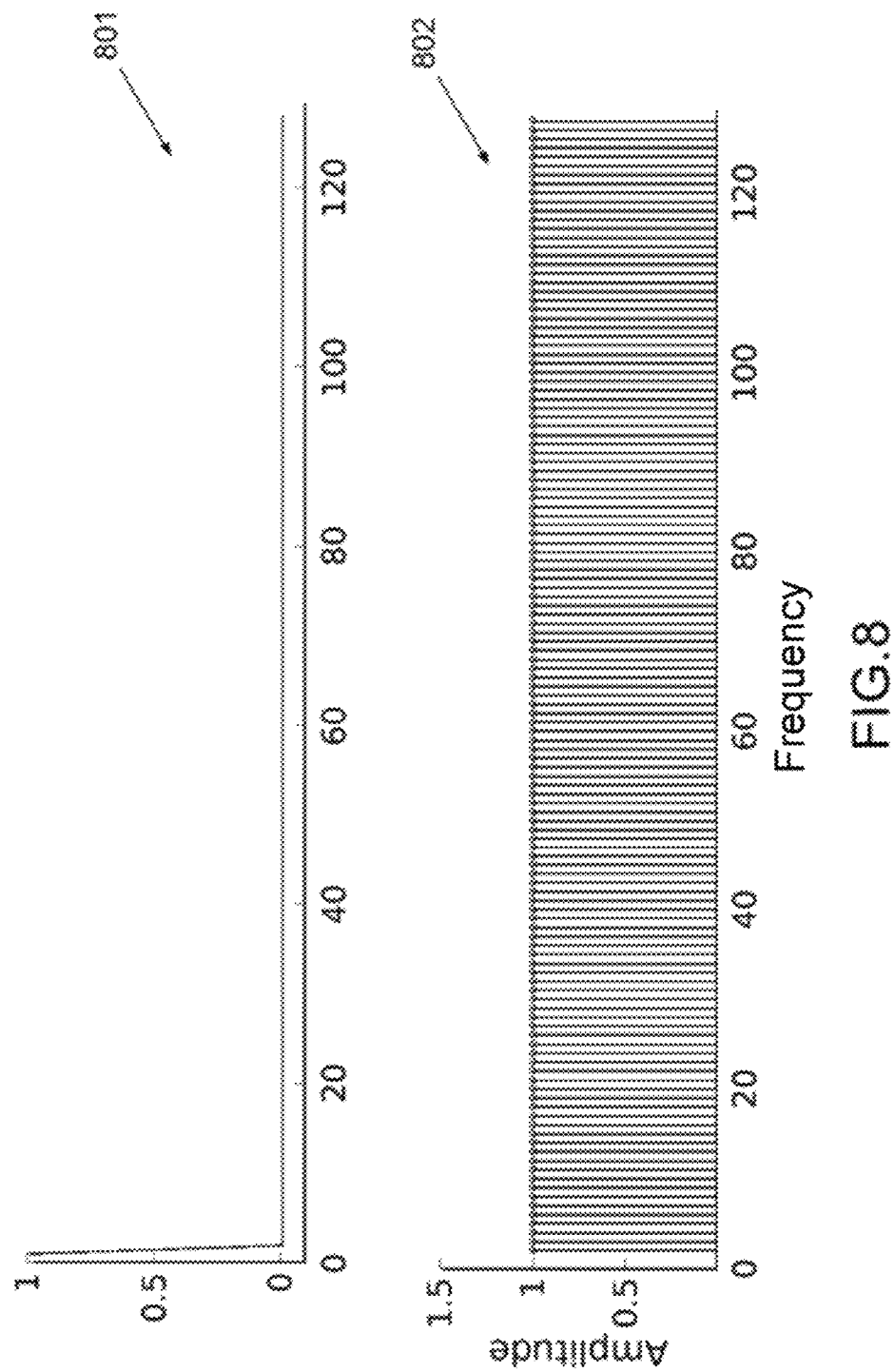

FIG. 8 illustrates the properties of the reflectometry signal obtained using the method according to the invention. The graph 802 shows the spectrum of the obtained signal. The carriers reserved for the compensation signal $c_k$ are in bold. All of the carriers are normalized, thereby making it possible to obtain a uniform power spectral density for this signal. The graph 801 shows the autocorrelation function of the signal. The distortions visible on the graph 501 are eliminated. The autocorrelation function 801 is substantially zero beyond the autocorrelation peak. The signal obtained by virtue of the invention may thus be used to perform reflectometry-based fault analysis.

One parameter of the invention is the clipping threshold A in step 702. The value of this threshold affects the clipping factor. Another parameter of the invention that also influences the clipping factor is the number of carriers reserved for the compensation signal. Lastly, the normalization step 706 added by the invention also influences the clipping factor.

In one embodiment of the invention, the number of reserved carriers is set a priori, for example on the basis of constraints specific to the payload signal.

In another embodiment, the number of reserved carriers is set through simulation, so as to select the number that makes it possible to obtain the most optimum clipping factor.

Likewise, the value A of the clipping threshold is determined through simulation so as to minimize the clipping factor, that is to say to minimize the peak to average power ratio of the signal.

Figure 9:
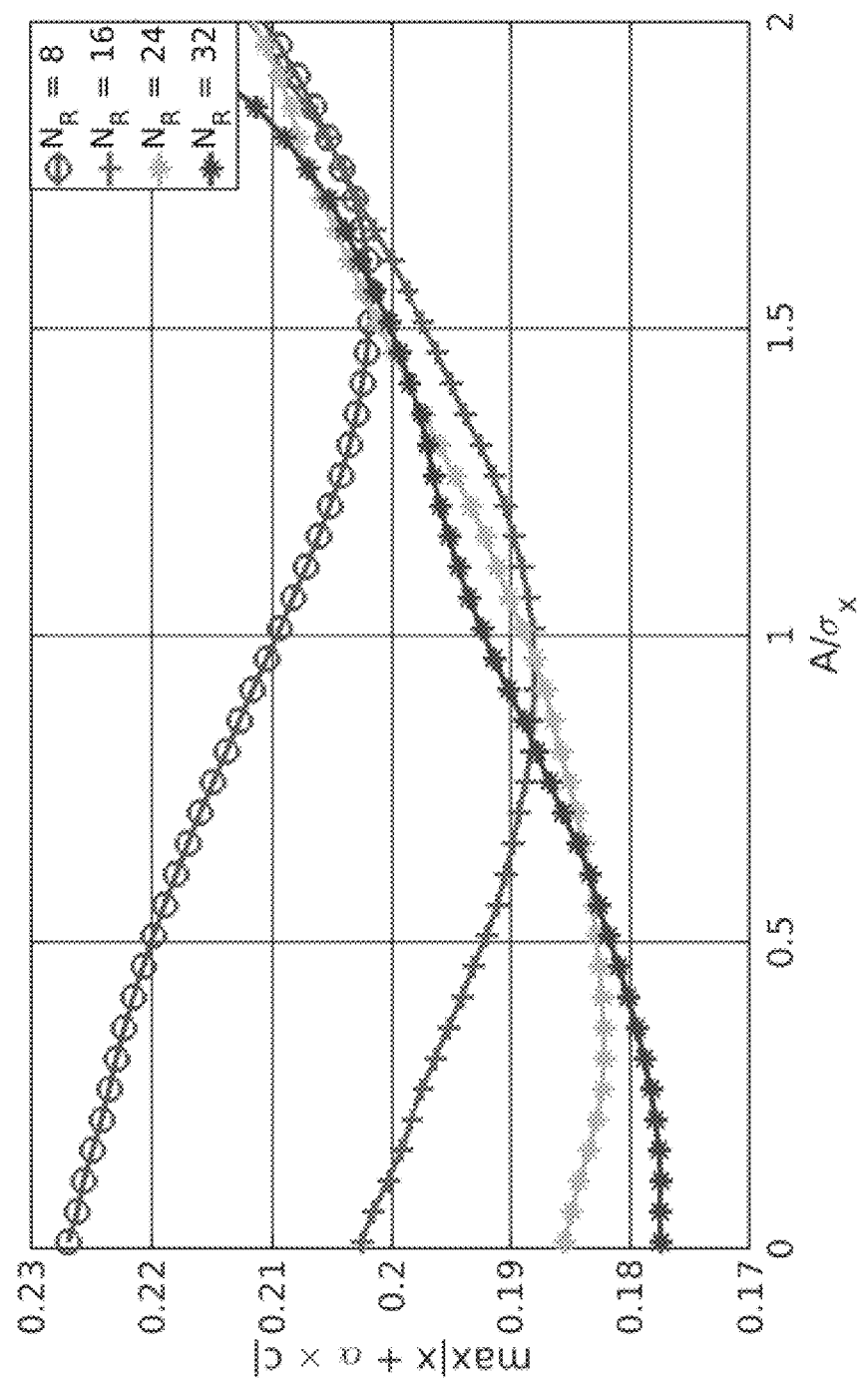
FIG. 9 shows a graph illustrating a method for determining a parameter of the invention.

FIG. 9 shows, on a graph, multiple curves giving the maximum amplitude (in terms of absolute value) of the signal as a function of the clipping threshold A normalized by the average power $\sigma_x$ of the payload signal. The four curves that are shown are obtained through simulation for numbers of reserved carriers $N_R$ respectively equal to 8, 16, 24 and 32 for a total number of carriers equal to 64.

These simulation curves make it possible to select the best compromise for the choice of the number of reserved carriers and the value of the clipping threshold, so as to obtain the lowest possible peak factor. For example, for a number of reserved carriers equal to 16, a value of $A/\sigma_x$ equal to 1 makes it possible to obtain the lowest peak factor. In general, one possible way of determining the optimum value of the clipping threshold is to construct a dual-entry table that gives the value of the optimum clipping threshold as a function of the total number of carriers and the number of reserved carriers.

The curves in FIG. 9 are obtained through simulation by modeling the signal obtained by applying the invention as follows:

$y_n = x_n + ac_n + d_n$, where $x_n$ is the initial payload signal and $c_n$ is the compensation signal.

The effect of the normalization step 706 may be modeled by the component $ac_n + d_n$, where a is an amplification factor linked to the normalization and $d_n$ is normalization noise that may be considered to be decorrelated noise.

The amplification factor a depends on the average power and on the average of the absolute value of the compensation signal.

The maximum value of the signal (ordinate of the graph of FIG. 9) may thus be estimated by the maximum value of $|x+ac|$.

Figure 10A:
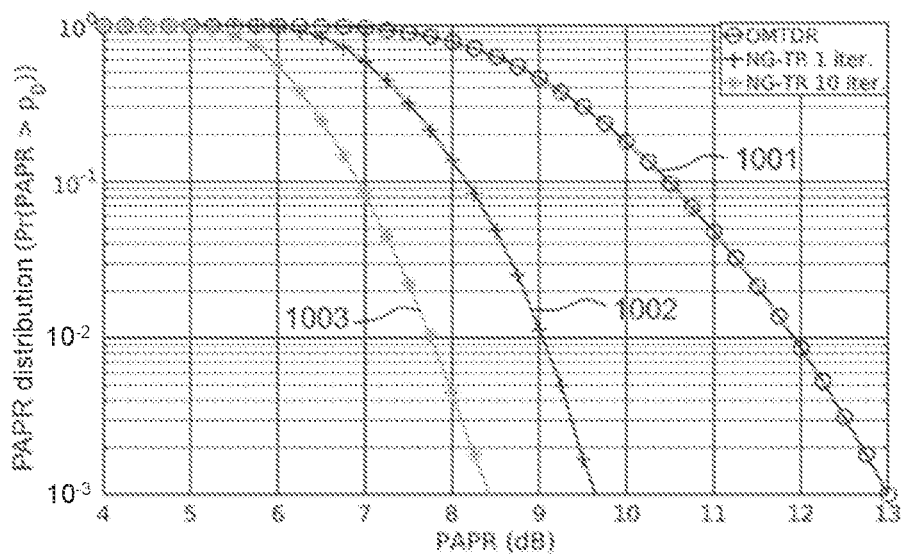
FIG. 10a illustrates, on a graph, comparative results between a signal obtained with and without the invention in a first application case.
Figure 10B:
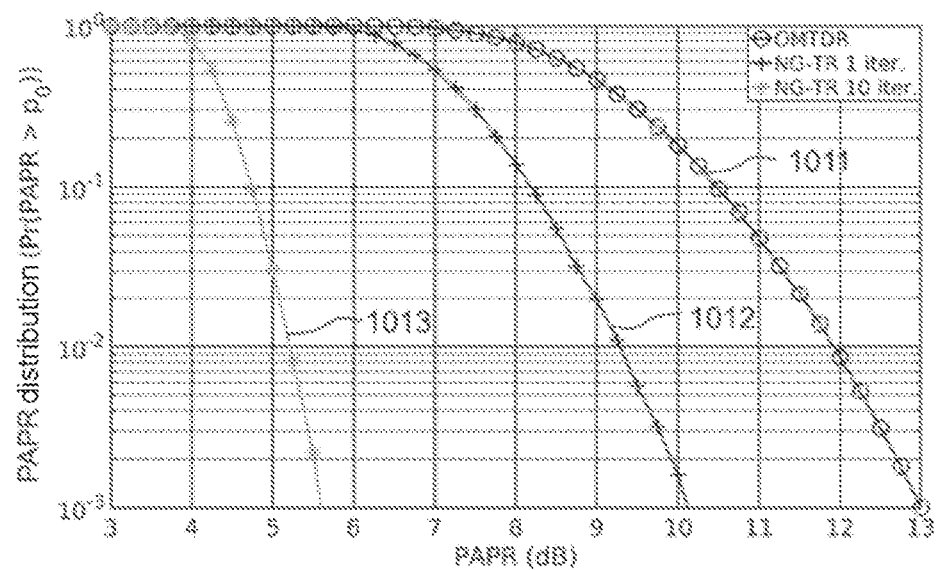
FIG. 10b illustrates, on a graph, comparative results between a signal obtained with and without the invention in a second application case.

FIGS. 10a and 10b show the distribution function of the peak factor (or PAPR) as a function of the value of the peak factor in dB. The distribution function gives the probability of the signal power exceeding a certain value $p_0$ expressed in decibels on the abscissa.

FIG. 10a illustrates results obtained for a number of reserved carriers equal to 12 out of 64. The curve 1001 is obtained for an OMTDR (orthogonal multi-carrier time domain reflectometry) signal based on an OFDM multi-carrier signal without using a peak factor reduction method. The curve 1002 is obtained for a signal generated using the invention. The curve 1003 is obtained for a signal generated using the invention and by applying 10 iterations of steps 701-704. It may be seen that the invention allows a significant gain (of the order of 4 dB for a probability of $10^{-2}$ and 10 iterations) on the reduction of the peak factor.

FIG. 10b illustrates the same type of results obtained for a number of reserved carriers equal to 32 out of 64. The curve 1011 is obtained for an OMTDR (orthogonal multi-carrier time domain reflectometry) signal based on an OFDM multi-carrier signal without using a peak factor reduction method. The curve 1012 is obtained for a signal generated using the invention. The curve 1013 is obtained for a signal generated using the invention and by applying 10 iterations of steps 701-704.

The invention has the advantage of reducing the peak factor of a multi-carrier reflectometry signal while still retaining an autocorrelation function that is compatible with a reflectometry application.

The method according to the invention may be implemented as a computer program, the method being applied so as to generate a reflectometry signal intended to be used within a reflectometry system of the type described in FIG. 3. The invention may be implemented as a computer program comprising instructions for the execution thereof. The computer program may be recorded on a recording medium that is able to be read by a processor.

The reference to a computer program that, when it is executed, performs any one of the previously described functions is not limited to an application program running on a single host computer. On the contrary, the terms computer program and software are used here in a general sense to refer to any type of computer code (for example, application software, firmware, microcode, or any other form of computer instruction) that may be used to program one or more processors so as to implement aspects of the techniques described here. The computing means or resources may notably be distributed ("cloud computing"), possibly using peer-to-peer technologies. The software code may be executed on any suitable processor (for example a microprocessor) or processor core or a set of processors, whether they are provided in a single computing device or distributed between several computing devices (for example such as possibly accessible in the environment of the device). The executable code of each program allowing the programmable device to implement the processes according to the invention may be stored for example in the hard disk or in read-only memory. Generally speaking, the program or programs may be loaded into one of the storage means of the device before being executed. The central unit is able to command and direct the execution of the instructions or software code portions of the program or programs according to the invention, which instructions are stored in the hard disk or in the read-only memory or else in the other abovementioned storage elements.

As an alternative, the reflectometry signal generator GEN according to the invention may also be implemented by way of a processor housed in a specific test device. The processor may be a generic processor, a specific processor, an application-specific integrated circuit (ASIC) or a field-programmable gate array (FPGA). The device according to the invention may use one or more dedicated electronic circuits or a general-purpose circuit. The technique of the invention may be carried out on a reprogrammable computing machine (a processor or a microcontroller for example) executing a program comprising a sequence of instructions, or on a dedicated computing machine (for example a set of logic gates such as an FPGA or an ASIC, or any other hardware module).

REFERENCES

[1] "On Line Wire Diagnosis using Multicarrier Time Domain Reflectometry for Fault Location" by A. Lelong and M. Olivas. (Sensors Conference, IEEE, pages 751-754, October 2009).

[2] "Peak power reduction for multicarrier transmission", José Tellado, John M. Cioffi, Information Systems Lab, Stanford University, September 1999.

The invention claimed is:

1. A method for generating a reflectometry signal configured to be injected into a transmission line in order to identify a presence of at least one possible fault on the transmission line, the method comprising the steps of:
   generating a first multi-carrier digital signal on a first set of frequency carriers with a reflectometry signal generator,
   generating a second corrective multi-carrier digital signal on a second set of frequency carriers separate from the first set with the reflectometry signal generator,
   summing the first multi-carrier digital signal and the second corrective multi-carrier digital signal so as to generate a reflectometry signal with the reflectometry signal generator, and
   normalizing the frequency carriers of the reflectometry signal with the reflectometry signal generator,
   wherein the second corrective multi-carrier digital signal being determined so as to reduce a peak to average power ratio of the reflectometry signal with respect to the first multi-carrier digital signal.

2. The method for generating a reflectometry signal as claimed in claim 1, furthermore comprising a step of selecting a number of frequency carriers allocated to the first multi-carrier digital signal.

3. A computer program comprising a non-transitory instructions for executing the method for generating a reflectometry signal as claimed in claim 1 when the computer program is executed by a processor.

4. A recording medium configured to be implemented by a processor and on which there is recorded a program comprising non-transitory instructions for executing the method for generating a reflectometry signal as claimed in claim 1 when the program is executed by the processor.

5. The method for generating a reflectometry signal as claimed in claim 1, furthermore comprising a step of injecting the reflectometry signal into a transmission line with a digital-to-analog converter and a coupling device.

6. The method for generating a reflectometry signal as claimed in claim 5, further comprising:
   acquiring and analyzing with an analog-to-digital converter and a processing device an echo of a reflected reflectometry signal in order to deduce therefrom information relating to a detection and/or a location of an impedance discontinuity characteristic of at least one fault; and
   displaying results of measurements of the echo on a human-machine interface.

7. The method for generating a reflectometry signal as claimed in claim 1, wherein the step of generating a second corrective multi-carrier digital signal comprises the substeps of:
   applying an inverse Fourier transform to the first multi-carrier digital signal,
   clipping a signal obtained at an output of the inverse Fourier transform at a predetermined clipping value,
   applying a direct Fourier transform to the clipped signal, and
   masking an output signal from the direct Fourier transform so as to zero frequencies of the frequency carriers of the first multi-carrier digital signal.

8. The method for generating a reflectometry signal as claimed in claim 7, wherein the substeps for generating the second corrective multi-carrier digital signal are iterated.

9. The method for generating a reflectometry signal as claimed in claim 7, wherein the clipping value is determined so as to minimize the peak to average power ratio of the reflectometry signal.

10. A device for generating a reflectometry signal configured to be injected into a transmission line in order to identify the presence of at least one possible fault on the transmission line, said device being configured to implement the method for generating a reflectometry signal as claimed in claim 1.

11. The device for generating a reflectometry signal as claimed in claim 10, comprising:
   a reflectometry signal generator configured so as to implement the method for generating a reflectometry signal, and
   a digital-to-analog converter and a coupling device for injecting the analog reflectometry signal into a transmission line.

12. A method for identifying a presence of at least one possible fault on a transmission line, the method comprising the steps of:
   generating a first multi-carrier digital signal on a first set of frequency carriers with a reflectometry signal generator,
   generating a second corrective multi-carrier digital signal on a second set of frequency carriers separate from the first set with the reflectometry signal generator,
   summing the first multi-carrier digital signal and the second corrective multi-carrier digital signal so as to generate a reflectometry signal with the reflectometry signal generator,
   normalizing the frequency carriers of the reflectometry signal with the reflectometry signal generator,
   the second corrective multi-carrier digital signal being determined so as to reduce a peak to average power ratio of the reflectometry signal with respect to the first multi-carrier digital signal,
   injecting the reflectometry signal into a transmission line with a digital-to-analog converter and a coupling device, and
   acquiring and analyzing with an analog-to-digital converter and a processing device an echo of a reflected reflectometry signal in order to deduce therefrom information relating to a detection and/or a location of an impedance discontinuity characteristic of at least one fault.

13. The method for identifying the presence of at least one fault as claimed in claim 12, wherein the step of analyzing the echo of the reflectometry signal comprises the substeps of:
   computing an intercorrelation between the reflected reflectometry signal and the reflectometry signal injected into the transmission line, in order to obtain a reflectogram, and
   analyzing the reflectogram in order to identify at least one amplitude peak characteristic of the presence of a fault on the transmission line.

14. The method for generating a reflectometry signal as claimed in claim 12, further comprising displaying results of measurements of the echo on a human-machine interface.

15. A device for identifying the presence of at least one possible fault on a transmission line, said device configured to implement the method for identifying the presence of at least one fault as claimed in claim 12.

16. The device for identifying the presence of at least one possible fault on a transmission line as claimed in claim 15, comprising:
   a coupling device for acquiring an echo of the reflected reflectometry signal, and
   an analog-to-digital converter and a processing device for analyzing the echo.

17. The device for identifying the presence of at least one possible fault on a transmission line as claimed in claim 16, wherein the processing device is configured to display results of measurements of the echo on a human-machine interface.

\* \* \* \* \*